(12) United States Patent
Hsieh et al.

(10) Patent No.: US 10,593,728 B1
(45) Date of Patent: Mar. 17, 2020

(54) INTEGRATED CIRCUITS AND METHODS FOR FABRICATING INTEGRATED CIRCUITS WITH MAGNETIC TUNNEL JUNCTION (MTJ) STRUCTURES

(71) Applicant: Globalfoundries Singapore Pte. Ltd., Singapore (SG)

(72) Inventors: Curtis Chun-I Hsieh, Singapore (SG); Wanbing Yi, Singapore (SG); Yi Jiang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/215,023

(22) Filed: Dec. 10, 2018

(51) Int. Cl.
| | |
|---|---|
| *G11B 5/39* | (2006.01) |
| *H01L 27/22* | (2006.01) |
| *H01L 43/02* | (2006.01) |
| *G11C 11/16* | (2006.01) |
| *H01L 43/12* | (2006.01) |
| *H01L 43/08* | (2006.01) |
| *G11B 5/31* | (2006.01) |

(52) U.S. Cl.
CPC .......... *H01L 27/228* (2013.01); *G11B 5/3163* (2013.01); *G11B 5/3909* (2013.01); *G11B 5/3945* (2013.01); *G11C 11/161* (2013.01); *H01L 43/02* (2013.01); *H01L 43/08* (2013.01); *H01L 43/12* (2013.01)

(58) Field of Classification Search
CPC ..... H01L 43/12; G11B 5/3163; G11B 5/3909; G11B 5/3945

USPC ........................................................ 360/324.2
See application file for complete search history.

(56) References Cited

U.S. PATENT DOCUMENTS

| | | | |
|---|---|---|---|
| 9,082,695 B2* | 7/2015 | Satoh | H01L 27/222 |
| 9,997,566 B1 | 6/2018 | Kim et al. | |
| 2010/0240189 A1* | 9/2010 | Jeong | H01L 21/7684 438/385 |
| 2012/0028373 A1* | 2/2012 | Belen | H01L 43/12 438/3 |
| 2015/0194599 A1* | 7/2015 | Park | H01L 43/12 438/3 |
| 2015/0249209 A1* | 9/2015 | Lu | H01L 43/12 257/421 |
| 2015/0311433 A1* | 10/2015 | Bae | H01L 43/12 438/3 |
| 2016/0111642 A1* | 4/2016 | Perniola | G11C 11/005 257/2 |
| 2017/0110649 A1* | 4/2017 | Diaz | H01L 27/222 |
| 2017/0309497 A1* | 10/2017 | Dieny | H01L 45/06 |
| 2018/0123031 A1* | 5/2018 | Adelmann | H01L 27/228 |
| 2018/0261649 A1* | 9/2018 | Annunziata | H01L 43/08 |

(Continued)

*Primary Examiner* — Jefferson A Evans
(74) *Attorney, Agent, or Firm* — Thompson Hine LLP (57) ABSTRACT

Integrated circuits and methods for fabricating magnetic tunnel junction (MTJ) structures and integrated circuits are provided. An exemplary method for fabricating an integrated circuit including a magnetic tunnel junction (MTJ) structure includes forming magnetic tunnel junction (MTJ) layers over a substrate. Further, the method includes forming a conductive pillar over the MTJ layers, wherein the conductive pillar is formed with an uppermost surface, and wherein the uppermost surface is not planarized. Also, the method includes etching the MTJ layers to form a pillar structure from portions of the MTJ layers underlying the conductive pillar.

19 Claims, 4 Drawing Sheets

(56) References Cited

U.S. PATENT DOCUMENTS

| | | | |
|---|---|---|---|
| 2019/0198755 A1* | 6/2019 | Ito | H01L 27/228 |
| 2019/0207098 A1* | 7/2019 | Kim | H01L 43/10 |
| 2019/0207105 A1* | 7/2019 | Boone | H01L 27/222 |
| 2019/0259941 A1* | 8/2019 | Yang | B82Y 25/00 |

* cited by examiner

INTEGRATED CIRCUITS AND METHODS FOR FABRICATING INTEGRATED CIRCUITS WITH MAGNETIC TUNNEL JUNCTION (MTJ) STRUCTURES

TECHNICAL FIELD

The technical field generally relates to integrated circuits, and more particularly relates to integrated circuits with conductive pillars overlying magnetic tunnel junction structures.

BACKGROUND

Magnetic (or magneto-resistive) random access memory (MRAM) is a non-volatile random access memory technology that could potentially replace the dynamic random access memory (DRAM) and flash memory as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive or TMR device) includes a structure having ferromagnetic layers separated by a non-magnetic layer (barrier), and arranged into a stacked magnetic tunnel junction (MTJ) structure. Digital information is stored and represented in the memory element as directions of magnetization vectors in the magnetic layers.

When an MRAM device is manufactured, magnetic tunnel junction (MTJ) layers are deposited and are typically etched by a physical etching process to form the MTJ structure. During the physical etching process, other conductive layers in the MTJ layer may be also etched together with the MTJ layer, and thus elements of the etched conductive layers may be re-deposited, as conductive by-products, on a sidewall of the MTJ structure, which may generate an electrical short.

Accordingly, it is desirable to provide a method of fabricating integrated circuits in which MTJ structures are formed with an MTJ conductive structure that is not etched. It is also desirable to provide integrated circuits with MTJ structures that are self-aligned with overlying MTJ conductive structures. Further, it is desirable to provide a method for fabricating an integrated circuit with MTJ structures that is cost effective and time efficient. Furthermore, other desirable features and characteristics will become apparent from the subsequent detailed description and the appended claims, taken in conjunction with the accompanying drawings and this background.

BRIEF SUMMARY

Integrated circuits and methods for fabricating magnetic tunnel junction (MTJ) structures and integrated circuits with MTJ structures are provided. An exemplary method for fabricating an MTJ structure includes forming MTJ layers over a substrate and forming a protective layer over an upper surface of the MTJ layers. The method includes depositing a sacrificial material over the protective layer and creating a via hole through the sacrificial material and through the protective layer. Also, the method includes depositing conductive material in the via hole in contact with the upper surface of the MTJ layers. The method further includes forming a hard mask in the via hole over the conductive material and planarizing the sacrificial material and the hard mask, wherein a portion of the hard mask remains in the via hole over the conductive material. Also, the method includes removing the sacrificial material and etching the protective layer and the MTJ layers to form a pillar structure from portions of the MTJ layers underlying the hard mask. Further, the method includes removing the hard mask to expose an upper surface of the conductive material.

An exemplary method for fabricating an integrated circuit including a magnetic tunnel junction (MTJ) structure includes forming magnetic tunnel junction (MTJ) layers over a substrate. Further, the method includes forming a conductive pillar over the MTJ layers, wherein the conductive pillar is formed with an uppermost surface, and wherein the uppermost surface is not planarized. Also, the method includes etching the MTJ layers to form a pillar structure from portions of the MTJ layers underlying the conductive pillar.

In yet another exemplary embodiment, an integrated circuit is provided. The integrated circuit includes a magnetic tunnel junction (MTJ) structure and a conductive pillar over the MTJ structure. The MTJ structure is self-aligned with the conductive pillar. Further, the conductive pillar is formed with an uppermost surface and the uppermost surface is not planarized.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the integrated circuits with magnetic tunnel junction structures or methods for fabricating integrated circuits with magnetic tunnel junction structures. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components. As used herein, when a layer or structure is a recited material, that material is present in the layer or structure in an amount of at least 50 wt. % in relation to the total weight of the layer or structure unless otherwise indicated. As used herein, when a layer or structure is primarily a recited material, that material is present in the layer or structure in an amount of at least 90 wt. % in relation to the total weight of the layer or structure unless otherwise indicated.

The drawings are semi-diagrammatic and not to scale. Particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly. Further, as used herein, "encapsulating" refers to completely surrounding and covering an element with another material or materials.

In accordance with the various embodiments herein, integrated circuits including magnetic tunnel junction (MTJ) structures and methods for fabricating integrated circuits with MTJ structures are provided. Generally, the following embodiments relate to the formation of a conductive pillar in a damascene process. In an exemplary embodiment, the conductive pillar is aligned with and formed over MTJ layers that are later formed into a MTJ pillar structure. The conductive pillar and MTJ pillar structure are aligned after formation, i.e., the conductive pillar is directly vertically over MTJ pillar structure. During fabrication, a sacrificial material is formed over MTJ layers and is patterned to form via holes at desired locations, such as directly over underlying conductive contacts. Conductive pillar are formed in the via holes. Thereafter, the sacrificial material may be removed such that the conductive pillars are formed without being etched. In the exemplary process, the MTJ layers are covered by a protective layer and sacrificial material during formation of the conductive pillars. Also, the conductive material forming the conductive pillars is never planarized, such that structural nonconformities caused by planarization are not introduced.

Figure 1:
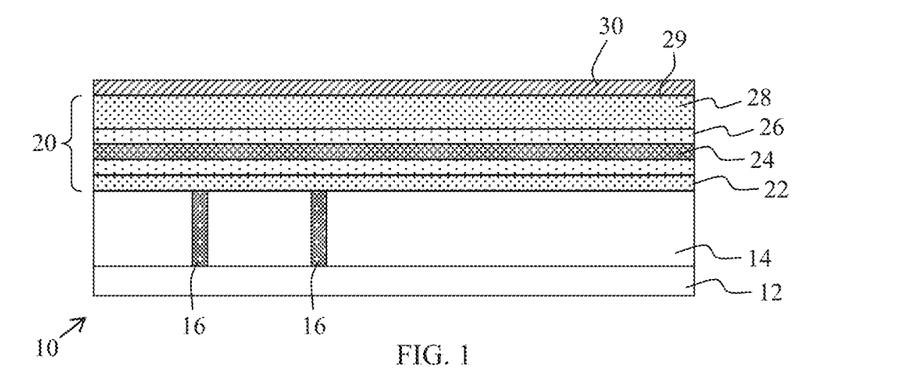
FIGS. 1-7 illustrate cross sectional views of a portion of an integrated circuit including a magnetic tunnel junction (MTJ) structure and a method of fabricating the same according to various embodiments herein.

FIGS. 1-7 illustrate, in cross section, an integrated circuit 10 and methods for fabricating an integrated circuit 10 in accordance with embodiments of the present disclosure. Each of FIGS. 1-7 illustrates a memory portion of the integrated circuit 10, wherein a stacked MTJ structure is, or stacked MTJ structures are, to be formed. The integrated circuit 10 illustrated in FIG. 1 includes a substrate 12, an inter-layer dielectric (ILD) layer 14 over the substrate 12, and a metallization layer 16 over and/or within the ILD layer 14. By the term "within," it is meant that a top surface of the metallization layer 16 is substantially coplanar with a top surface of the ILD layer 14, and the metallization layer 16 extends downward into the ILD layer 14, as illustrated in FIG. 1. The top surface of the metallization layer 16 forms a conductive conduct, such as a bottom logic contact, for electrical connection to later-formed stacked MTJ structures.

The ILD layer 14 may be formed of one or more low-k dielectric materials such as, for example, un-doped silicate glass (USG), silicon nitride, silicon oxynitride, or other commonly used materials. The dielectric constants (k value) of the low-k dielectric materials may be less than about 3.9, for example, less than about 2.8. The metallization layer 16 may be formed of a metal, such as copper or copper alloys. In one particular, non-limiting embodiment, the metallization layer 16 is a third metallization layer (M3) or fourth metallization layer (M4). One skilled in the art will realize the formation details of the ILD layer 14 and the metallization layer 16.

Though not illustrated for simplicity in FIGS. 1-7, the ILD layer 14 and the metallization layer 16 may be formed over other ILD and/or metallization layers, and also over an active region of a semiconductor substrate 12 forming part of the structure of the integrated circuit 10. As used herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. The substrate may further include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET): bipolar junction transistors (BJT); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit device, such as a logic device, memory device, radio frequency (RF) device, input/output (I/O) device, system-on-chip (SoC) device, combinations thereof, or other suitable types of devices.

While not illustrated, a passivation layer may be formed over the top surface of the metallization layer 16 and the ILD layer 14. An exemplary passivation layer may be formed of a non-organic material selected from un-doped silicate glass (USG), silicon nitride, silicon oxynitride, silicon oxide, or combinations thereof. In some alternative embodiments, the passivation layer may be formed of a polymer material, such as an epoxy, polyimide, benzocyclobutene (BCB), polybenzoxazole (PBO), or the like, although other relatively soft, often organic, dielectric materials may also be used. In a specific, non-limiting embodiment, the passivation layer may be formed of a silicon carbide-based passivation material including nitrogen. In one example, silicon carbide with nitrogen deposited using chemical vapor deposition (CVD) from a trimethylsilane source, which is commercially available from Applied Materials under the tradename of BLOK®, is used as the passivation layer 18. The compound with less nitrogen (N) (less than about 5 mol %), i.e., $Si_aC_bN_cH_d$, is referred to as "BLoK", and the compound with more N (about 10 mol % to about 25 mol %), i.e., $Si_wC_xN_yH_z$, is referred to as "NBLoK". BLoK has a lower dielectric constant of less than 4.0, whereas NBLoK has a dielectric constant of about 5.0. While BLoK is not a good oxygen barrier but is a good copper (Cu) barrier, NBLoK is both a good oxygen barrier and a good Cu barrier. In an exemplary embodiment, the passivation layer 18 is or includes NBLoK material.

In FIG. 1, the illustrated method includes depositing a stack of magnetic tunnel junction (MTJ) layers 20 over the ILD layer 14. The stack of MTJ layers 20 may include a bottom electrode layer 22 that is formed over the ILD layer 14 and metallization layer 16. An exemplary bottom electrode layer 22 is a conductive material, such as a metal, including metal alloys. In an exemplary embodiment, bottom electrode layer 22 is tantalum, tantalum nitride, titanium, tungsten, and/or other commonly used conductive metals. In an exemplary embodiment, the bottom electrode layer 22 is formed by depositing the conductive material by a CVD process.

The MTJ layers 20 may further include MTJ material layers 24 and 26 that are successively blanket deposited. It is noted that while only two layers 24 and 26 are illustrated, any number of desired and suitable MTJ material layers may be used. In an exemplary embodiment, the MTJ material layers 24 and 26 include a pinning layer, fixed magnetic layer, tunnel barrier layer, and free magnetic layer, spacer/capping layer, as well as optional seed layers, wetting layers, spacer layers, anti-ferromagnetic layers, and the like. It is realized that MTJ layers 20 of many variations are within the scope of the present disclosure. FIG. 1 further illustrates that the MTJ layers 20 include a top electrode layer 28 as an uppermost layer. Thus, the top electrode layer 28 terminates at an uppermost surface 29, which is the uppermost surface of the stack of MTJ layers 20. An exemplary top electrode layer 28 is a conductive material, such as a metal or a metal alloy. In an exemplary embodiment, top electrode layer 28 is tantalum, tantalum nitride, titanium, tungsten, and/or other commonly used conductive metals. In an exemplary embodiment, the top electrode layer 28 is formed by depositing the conductive material by a CVD process.

As further shown in FIG. 1, the method includes forming a protective layer 30 over the uppermost surface 29 of the MTJ layers 20. In an exemplary embodiment, the material forming the protective layer 30 is silicon nitride or silicon oxide. The material forming the protective layer 30 may be blanket deposited, such as by a CVD process.

Figure 2:
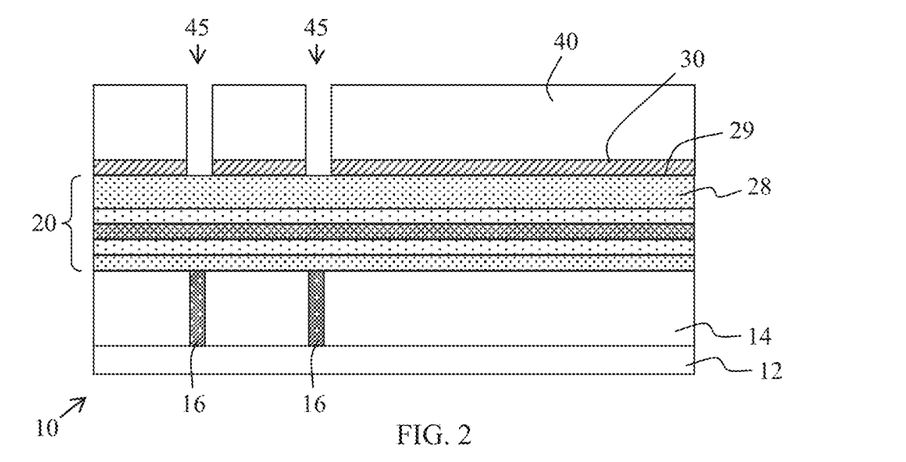

FIG. 2 depicts the result of a material deposition process followed by an etching process, which result in the illustrated device structure. In FIG. 2, the method may continue with depositing a sacrificial material 40 over the protective layer 30. In an exemplary embodiment, the sacrificial material 40 is an organic material. In exemplary embodiments, the sacrificial material 40 has a different etch rate as compared to the top electrode layer 28.

As shown in FIG. 2, the method includes etching via holes 45 through the sacrificial material 40 and through the protective layer 30. Thus, the via holes 45 land on and expose a portion of the uppermost surface 29 of the top electrode layer 28. In an exemplary embodiment, the sacrificial material 40 is patterned according to conventional masking and lithography techniques. In an exemplary embodiment, the via holes 45 are etched by an anisotropic etching process.

Figure 3:
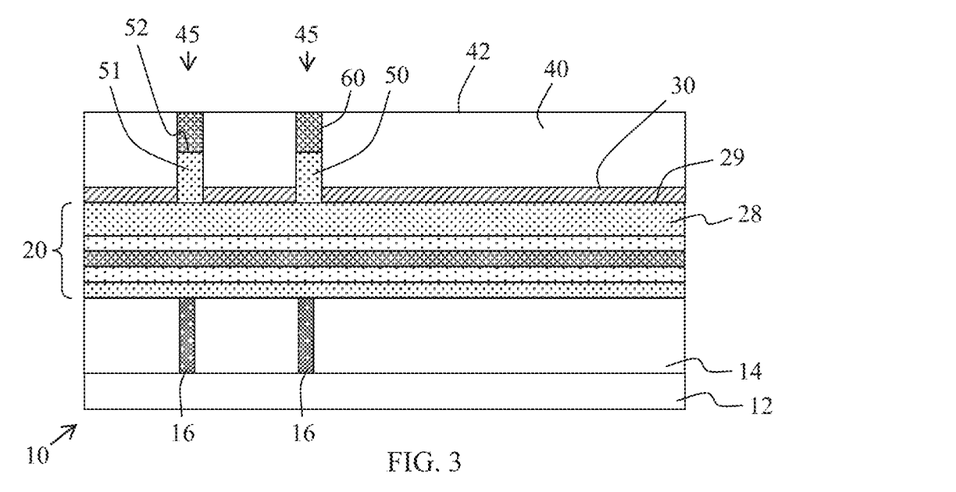

FIG. 3 depicts the result of a two material deposition processes followed by a planarization process, which result in the illustrated device structure. In FIG. 3, the method includes depositing conductive material 50 in the via holes 45 and in direct contact with the uppermost surface 29. In an exemplary embodiment, the conductive material 50 is deposited by a selective or self-aligned deposition process. An exemplary conductive material 50 is a metal, such as ruthenium, tungsten, cobalt, or other metal that may be deposited in a selective or self-aligned process. An exemplary deposition process is CVD or glancing CVD.

In exemplary embodiments, the conductive material 50 only partially fills the via holes 45 and forms conductive pillars 51 that terminate at an uppermost surface 52 of the conductive material 50 that lies below the uppermost surface 42 of the sacrificial material 40.

As shown in FIG. 3, the method may continue with forming hard masks 60 in the via holes 45 over the conductive pillars 51. For example, a hard mask material such as silicon oxide, silicon nitride, or carbon may be deposited into the via holes 45. In exemplary embodiments, the hard mask material completely fills the via holes 45 and may form an overburden portion over the uppermost surface 42 of the sacrificial material 40.

Thereafter, the method may include planarizing the uppermost surface 42 of the sacrificial material 40 and the overburden portion of the hard mask material. After planarizing the sacrificial material and the hard mask, a portion of hard mask material remains in the via holes 45. Thus, the planarization process defines the hard masks 60 in the via holes 45. As is clear from FIG. 3, the conductive pillars 51 are shielded from the planarization process by the hard masks 60.

Figure 4:
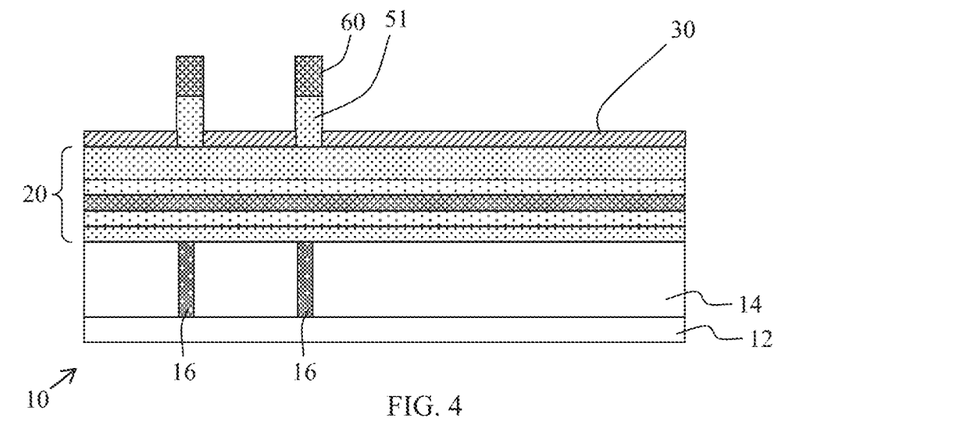

As shown in FIG. 4, the method includes removing the sacrificial material 40. In an exemplary embodiment, the sacrificial material 40 is removed by a conventional etch process with an etchant selective to etching the sacrificial material 40.

Figure 5:
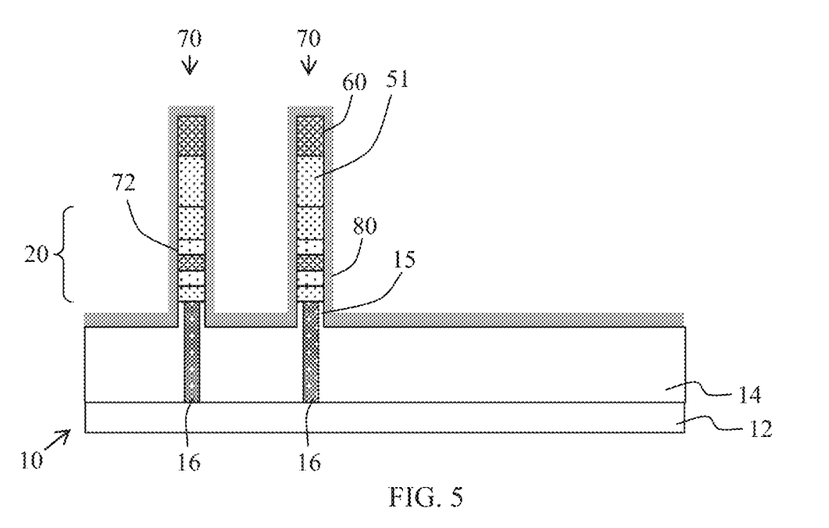

In FIG. 5, the method includes etching the protective layer and the MTJ layers 20 to form pillar structures 70 from portions of the MTJ layers 20 underlying the hard masks 60. In an exemplary embodiment, the etching process completely removes the protective layer. As shown, each pillar structure 70 is formed with opposite sidewalls 72 that are aligned with the respective hard mask 60. In an exemplary embodiment, the protective layers and the MTJ layers 20 are etched by an anisotropic etching process.

In exemplary embodiments, the process for etching the protective layer and the MTJ layers 20 also etches into the ILD layer 14. In an exemplary embodiment, the ILD layer 14 may be etched to a depth of about 100 nm. As shown, portions 15 of the ILD layer 14 lying directly under the hard masks 60 are unetched such that the metallization layer 16 is not contacted or exposed by the etching process.

In FIG. 5, the method further includes depositing an encapsulation material 80 over the ILD layer 14 and over and around the pillar structure 70. An exemplary encapsulation material 80 is a silicon nitride or silicon oxide deposited by a low temperature process.

Figure 6:
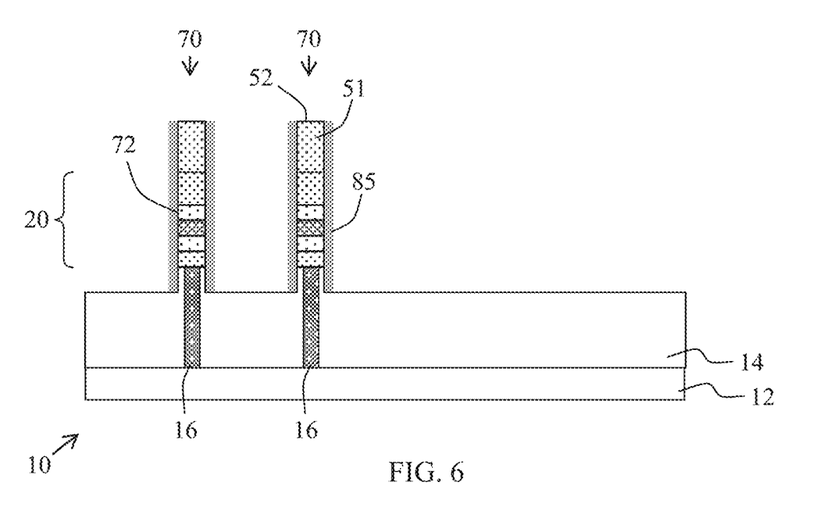

In FIG. 6, the method includes etching the encapsulation material 80 from the ILD layer 14 and from over the pillar structure 70 to define an encapsulation layer 85 around the sidewalls 72 of each pillar structure 70. In an exemplary embodiment, the encapsulation material 80 is etched by an anisotropic etching process. Further, the etching process may include removing the hard mask 60 from each pillar structure 70 to expose the uppermost surface 52 of the conductive pillar 51. In other embodiments, a second etch process, such as an etch process selective to the hard mask material, may be used to remove the hard mask 60 from each pillar structure 70 to expose the uppermost surface 52 of the conductive pillar 51.

Figure 7:
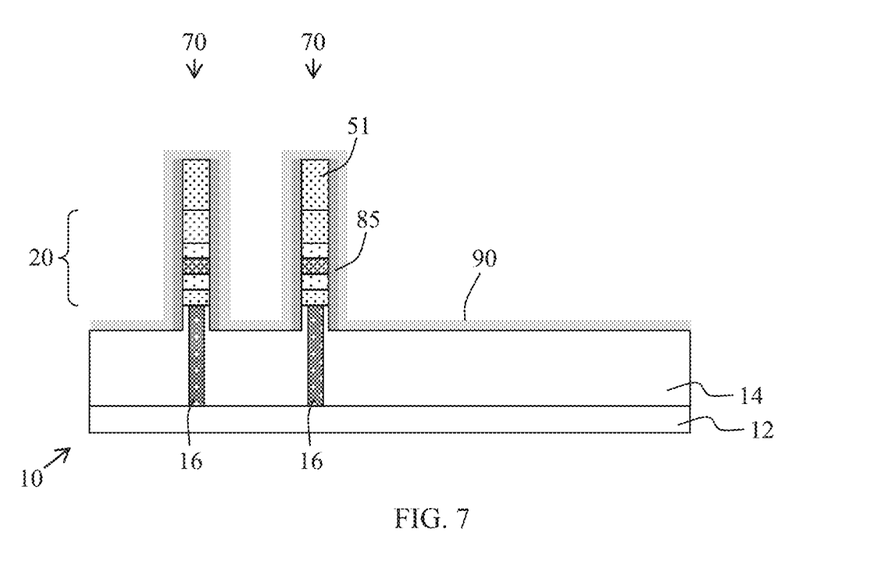

FIG. 7 illustrates an optional deposition of additional encapsulation material to form a second encapsulation layer 90 over and around the pillar structure 70. The second encapsulation material may be the same as material 80. The second encapsulation layer 90 may be included to facilitate integration of the process of FIGS. 1-7 with other fabrication processing occurring for fabrication of the integrated circuit 10.

Further processing may involve the deposition of successive dielectric layers and metallization layers and the electrical connection of the uppermost surface 52 of the conductive pillar 51 to an overlying metallization layer as is common in semiconductor processing.

As described herein, integrated circuits with magnetic tunnel junction structures and methods for fabricating integrated circuits with magnetic tunnel junction structures are provided. The integrated circuits and methods described herein provide enhanced protection of MTJ layers 20 in the MTJ pillar structure 70 by forming a conductive pillar 51 over the MTJ layers 20 while the MTJ layers are covered by a protective layer 30 and sacrificial material 40. Further, the conductive material 50 forming the conductive pillars 51 is never planarized, avoiding the introduction of structural nonconformities to the conductive pillars 51 and retaining surface uniformity for improvement in resistance. As a result, the MTJ pillar structure 70 in the fabricated integrated circuit 10 may exhibit improved performance. As described, the exemplary integrated circuits and methods allow for forming conductive pillars with reduced critical dimension, as compared to conventional methods that perform lithography on conductive pillars. In summary, the damascene process increases process margin and lowers top electrode resistance.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof

What is claimed is:

1. A method for fabricating a magnetic tunnel junction (MTJ) structure, the method comprising:
   forming magnetic tunnel junction (MTJ) layers over a substrate;
   forming a protective layer over an upper surface of the MTJ layers;
   depositing a sacrificial material over the protective layer;
   creating a via hole through the sacrificial material and through the protective layer;
   depositing conductive material in the via hole in contact with the upper surface of the MTJ layers;
   forming a hard mask over the conductive material in the via hole;
   planarizing the sacrificial material and the hard mask, wherein a portion of the hard mask remains in the via hole over the conductive material;
   after planarizing the sacrificial material and the hard mask, removing the sacrificial material;
   etching the protective layer and the MTJ layers to form a pillar structure from portions of the MTJ layers underlying the hard mask; and
   removing the hard mask to expose an upper surface of the conductive material.

2. The method of claim 1 further comprising:
   forming an encapsulation layer around sidewalls of the pillar structure.

3. The method of claim 1 further comprising:
   depositing an encapsulation material over the substrate and over and around the pillar structure; and
   etching the encapsulation material from the substrate and from over the pillar structure to define an encapsulation layer around sidewalls of the pillar structure.

4. The method of claim 1 further comprising:
   forming a first encapsulation layer around sidewalls of the pillar structure before removing the hard mask; and
   after removing the hard mask, forming a second encapsulation layer over and around the pillar structure.

5. The method of claim 1 further comprising:
   before forming the MTJ layers over the substrate, forming a dielectric layer over the substrate; and
   before forming the MTJ layers over the substrate, forming a conductive contact over and/or in the dielectric layer;
   wherein forming the MTJ layers over the substrate comprises forming the MTJ layers over the conductive contact.

6. The method of claim 1 further comprising:
   before forming the MTJ layers over the substrate, forming a dielectric layer over the substrate; and
   before forming the MTJ layers over the substrate, forming a conductive contact over and/or in the dielectric layer;
   wherein forming the MTJ layers over the substrate comprises forming the MTJ layers over the conductive contact; and
   wherein creating the via hole through the sacrificial material and through the protective layer comprises aligning the via hole directly over the conductive contact.

7. The method of claim 1 further comprising:
   forming a dielectric layer over the substrate,
   wherein forming the MTJ layers over the substrate comprises forming the MTJ layers over the dielectric layer, and
   wherein etching the protective layer and the MTJ layers to form the pillar structure comprises etching the protective layer, the MTJ layers, and a portion of the dielectric layer.

8. The method of claim 1 wherein the MTJ layers include a top electrode layer forming the upper surface.

9. The method of claim 1 wherein removing the hard mask to expose the upper surface of the conductive material comprises:
   etching the hard mask such that the upper surface of the conductive material is never planarized.

10. A method for fabricating an integrated circuit including a magnetic tunnel junction (MTJ) structure, the method comprising:

forming a dielectric layer over the substrate;
forming magnetic tunnel junction (MTJ) layers over a substrate;
depositing a sacrificial material over the MTJ layers;
etching a via hole through the sacrificial material;
depositing conductive material in the via hole in contact with the uppermost surface of the MTJ layers to form a conductive pillar over the MTJ layers, wherein the conductive pillar is formed with an uppermost surface, and wherein the uppermost surface is not planarized; and
etching the MTJ layers to form a pillar structure from portions of the MTJ layers underlying the conductive pillar,
wherein forming the MTJ layers over the substrate comprises forming the MTJ layers over the dielectric layer, and
wherein etching the MTJ layers to form the pillar structure comprises etching the MTJ layers and a portion of the dielectric layer.

11. The method of claim 10 further comprising:
forming a hard mask over the conductive pillar;
planarizing the sacrificial material and the hard mask, wherein a portion of the hard mask remains over the conductive material;
removing the sacrificial material; and
removing the hard mask to expose the uppermost surface of the conductive pillar.

12. The method of claim 11 wherein removing the sacrificial material comprises:
etching the sacrificial material, and
wherein removing the hard mask comprises:
etching the hard mask.

13. The method of claim 11 further comprising:
forming a first encapsulation layer around sidewalls of the pillar structure before removing the hard mask; and
after removing the hard mask, forming a second encapsulation layer over and around the pillar structure.

14. The method of claim 10 further comprising:
depositing an encapsulation material over the substrate and over and around the pillar structure; and
etching the encapsulation material from the substrate and from over the pillar structure to define an encapsulation layer around sidewalls of the pillar structure.

15. The method of claim 10 further comprising:
forming a dielectric layer over the substrate; and
forming a conductive contact over and/or in the dielectric layer;
wherein forming the MTJ layers over the substrate comprises forming the MTJ layers over the conductive contact.

16. The method of claim 10 further comprising:
forming a dielectric layer over the substrate; and
forming a conductive contact over and/or in the dielectric layer;
wherein forming the MTJ layers over the substrate comprises forming the MTJ layers over the conductive contact;
wherein forming the conductive pillar over the MTJ layers comprises aligning the conductive pillar directly over the conductive contact.

17. The method of claim 10 wherein the MTJ layers include a top electrode layer forming the uppermost surface.

18. A method for fabricating an integrated circuit including a magnetic tunnel junction (MTJ) structure, the method comprising:
forming magnetic tunnel junction (MTJ) layers over a substrate;
forming a conductive pillar over the MTJ layers, wherein the conductive pillar is formed with an uppermost surface, and wherein the uppermost surface is not planarized;
etching the MTJ layers to form a pillar structure from portions of the MTJ layers underlying the conductive pillar;
depositing an encapsulation material over the substrate and over and around the pillar structure; and
etching the encapsulation material from the substrate and from over the pillar structure to define an encapsulation layer around sidewalls of the pillar structure.

19. The method of claim 18 wherein forming the conductive pillar over the MTJ layers comprises:
depositing a sacrificial material over the MTJ layers;
etching a via hole through the sacrificial material; and
depositing conductive material in the via hole to form the conductive pillar.

* * * * *